United States Patent
Jin et al.

(10) Patent No.: US 9,030,900 B2
(45) Date of Patent: May 12, 2015

(54) SEMICONDUCTOR DEVICE, SEMICONDUCTOR MEMORY DEVICE AND OPERATION METHOD THEREOF

(75) Inventors: Sin-Hyun Jin, Gyeonggi-do (KR); Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 498 days.

(21) Appl. No.: 13/333,941

(22) Filed: Dec. 21, 2011

(65) Prior Publication Data

US 2012/0275251 A1    Nov. 1, 2012

(30) Foreign Application Priority Data

Apr. 27, 2011    (KR) .................. 10-2011-0039629

(51) Int. Cl.
| G11C 7/00 | (2006.01) |
|---|---|
| G11C 7/02 | (2006.01) |
| G11C 7/06 | (2006.01) |
| G11C 7/08 | (2006.01) |
| G11C 11/4074 | (2006.01) |
| G11C 11/4091 | (2006.01) |
| G11C 5/14 | (2006.01) |

(52) U.S. Cl.
CPC ....... *G11C 7/065* (2013.01); *G11C 7/08* (2013.01); *G11C 11/4074* (2013.01); *G11C 11/4091* (2013.01); *G11C 5/147* (2013.01)

(58) Field of Classification Search
USPC ........ 365/189.09, 202, 204, 207, 208, 230.06
See application file for complete search history.

(56) References Cited

U.S. PATENT DOCUMENTS

| 6,115,316 A * | 9/2000 | Mori et al. ............... 365/230.03 |
|---|---|---|
| 7,447,100 B2 * | 11/2008 | Jang .............................. 365/226 |
| 7,613,059 B2 * | 11/2009 | Kang ............................ 365/207 |
| 2012/0275251 A1 * | 11/2012 | Jin et al. ....................... 365/203 |

FOREIGN PATENT DOCUMENTS

| KR | 1020020009120 | 2/2002 |
|---|---|---|
| KR | 1020020057280 | 7/2002 |
| KR | 1020030066440 | 8/2003 |
| KR | 1020030081996 | 10/2003 |

OTHER PUBLICATIONS

Notice of Allowance issued by the Korean Intellectual Property Office on Jul. 23, 2012.

\* cited by examiner

*Primary Examiner* — Thao H Bui
(74) *Attorney, Agent, or Firm* — IP & T Group LLP

(57) ABSTRACT

A semiconductor memory device includes a bit line sense amplification unit configured to sense/amplify data loaded on a bit line, and a driving control unit configured to supply a power line of the bit line sense amplification unit with an overdriving voltage in an overdriving period and supply an internal voltage line with a voltage of the power line of the bit line sense amplification unit in a discharge driving period.

19 Claims, 5 Drawing Sheets

SEMICONDUCTOR DEVICE, SEMICONDUCTOR MEMORY DEVICE AND OPERATION METHOD THEREOF

CROSS-REFERENCE TO RELATED APPLICATIONS

The present application claims priority of Korean Patent Application No. 10-2011-0039629, filed on Apr. 27, 2011, which is incorporated herein by reference in its entirety.

BACKGROUND

1. Field

Exemplary embodiments of the present invention relate to semiconductor design technology, and more particularly, to an overdriving operation and an internal voltage generation operation of a semiconductor memory device.

2. Description of the Related Art

The continuous scale-down of a line width and a cell size of a semiconductor memory chip is accelerating the reduction in power consumption of a semiconductor memory chip. As a result, the design technology for satisfying performance required in a low-voltage environment has been developed.

The most of semiconductor memory chips supply voltages to internal circuits for their operation by using an internal voltage generation circuit. The internal voltage generation circuit typically receives an external power supply voltage VDD from an exterior to generate an internal voltage.

A memory element such as a dynamic random access memory (DRAM), which utilizes a bit line sense amplifier, uses a core voltage VCORE to sense cell data.

When a word line selected and activated by a row address, data of a plurality of memory cells connected to the selected word line is delivered to bit lines, and a bit line sense amplifier senses and amplifies a voltage difference between a pair of bit lines.

In general, since several thousands of bit line sense amplifiers operate at the same time, a large amount of current may be consumed at a time at a terminal of a core voltage (VCORE) used to drive a pull-up power line RTO of the bit line sense amplifier.

However, in the trend of a lower operation voltage, there is a limitation in amplifying data of many cells using a core voltage VCORE at a time.

Accordingly, a bit line sense amplifier overdriving method has been adopted. In the initial operation of the bit line sense amplifier, that is, immediately after charge sharing between a memory cell and a bit line, the pull-up power line RTO of the bit line sense amplifier is driven by an overdriving voltage (typically, an external power supply voltage VDD) having a level higher than the core voltage VCORE for a certain time.

As described above, when the external power supply voltage VDD input from an exterior is used as the overdriving voltage, data of many cells may be stably amplified at a time by using a current of which amount is adequately ensured.

However, since the level of the power supply voltage VDD is relatively very higher than the target level of the core voltage, it takes a long time to return to the target level of the core voltage. That is, the voltage level of the pull-up power line RTO may not immediately return to the target level of the core voltage even after an overdriving operation period.

To rapidly drop the voltage level of pull-up power line RTO, which has been increased by the overdriving operation, to the target level of the core voltage VCORE after the overdriving operation period, a discharge driving method has been adopted to instantaneously discharge the pull-up power line RTO to reach the target level of the core voltage VCORE.

FIG. 1 is a detailed circuit diagram illustrating the configuration of a bit line sense amplifier array of a semiconductor memory device adopting an overdriving method and a discharge driving method in accordance with the conventional art.

Referring to FIG. 1, the bit line sense amplifier array includes a bit line sense amplifier 30, an upper bit line separation unit 10, a lower bit line separation unit 50, a bit line equalize/precharge unit 20, a column selection unit 40, and a bit line sense amplifier power line driving unit 60.

The upper bit line separation unit 10 selectively separates/connects an upper memory cell array from/to the sense amplifier 30 in response to an upper separation signal BISH, and the lower bit line separation unit 50 selectively separates/connects a lower memory cell array from/to the sense amplifier 30 in response to a lower separation signal BISL.

When an enable signal is activated to drive a pull-down power line SB and a pull-up power line RTO at a set voltage level, the bit line sense amplifier 30 senses a voltage difference between a pair of bit lines BL and BLB, which are in a charge-sharing state and have a minute voltage difference therebetween, and amplifies voltages of the bit lines BL and BLB respectively to a ground voltage VSS and a core voltage VCORE or otherwise.

The bit line equalize/precharge unit 20 precharges the pair of bit lines BL and BLB to a level of a bit line precharge voltage VBLP (typically, VCORE/2) in response to a bit line equalize signal BLEQ after sense amplification and restoration processes for the bit lines are ended.

When a read command is applied, the column selection unit 40 delivers data sensed/amplified by the sense amplifier 30 to segment data buses SIO and SIOB in response to a column selection signal YI.

The bit line sense amplifier power line driving unit 60 includes an NMOS transistor M2 acting as a driver for normal driving, an NMOS transistor M3, an NMOS transistor M1 acting as a driver for overdriving, an NMOS transistor M4 acting as a driver for discharge driving, and a bit line sense amplifier power line equalize/precharge section 62.

The NMOS transistor M2 drives the power line RTO by using a voltage applied to the core voltage (VCORE) terminal in response to a pull-up power line driving control signal SAP activated in a normal driving period. The NMOS transistor M3 drives the power line SB by using the ground voltage VSS in response to a pull-down power line driving control signal SAN. The NMOS transistor M1 drives the power line RTO by using the external power supply voltage VDD in response to an overdriving pulse SAOVDP activated in an overdriving period. The NMOS transistor M4 drives the power line RTO by using the ground voltage VSS in response to a discharge driving pulse SADCDP activated in a discharge driving period. The bit line sense amplifier power line equalize/precharge section 62 precharges the power line RTO and the power line SB of the bit line sense amplifier 30 by using a bit line precharge voltage VBLP in response to the bit line equalize signal BLEQ.

Here, the case has been described, in which the overdriving pulse SAOVDP and the discharge driving pulse SADCDP are defined as a high active pulse, the NMOS transistor M1 is used as the driver for overdriving, and the NMOS transistor M4 is used as the driver for discharge driving. However, a PMOS transistor may be used as the driver for overdriving and the driver for discharge driving. As a transistor controlled by the pull-up power line driving control signal SAP, a PMOS transistor may be used instead of the NMOS transistor M2, FIG. 2 is a timing diagram illustrating a change in the voltage level of the power line RTO of the bit line sense amplifier at the sense amplification operation of the semiconductor memory device adopting the overdriving method and the discharge driving method in accordance with the conventional art shown in FIG. 1.

Referring to FIG. 2, since the power line RTO of the bit line sense amplifier is driven by the external power supply voltage VDD when the overdriving pulse SAOVDP is activated and an overdriving period OVERDRIVE starts, the voltage level of the power line RTO of the bit line sense amplifier rapidly rises and reaches the level of the external power supply voltage VDD.

Then, when the overdriving pulse SAOVDP is deactivated and the overdriving period OVERDRIVE ends, the power line RTO is not driven by the external power supply voltage VDD, and the voltage level of the power line RTO rapidly falls. At this time, the voltage level of the power line RTO rapidly falls, but does not reach the level of the core voltage VCORE. This is because an operation (a bit line sense amplification operation) rapidly using charge loaded on the power line RTO has been already performed in the overdriving period OVERDRIVE and thus the voltage level of the power line RTO falls through the natural discharge of charge after the overdriving period OVERDRIVE.

Accordingly, the conventional art controls the discharge driving operation to be performed after the overdriving operation is performed. That is, when the discharge driving pulse SADCDP is activated and a discharge driving period RELEASE starts, the voltage level of the power line RTO, which has fallen to a voltage level higher than the level of the core voltage VCORE by a certain degree after the overdriving period OVERDRIVE ends, rapidly falls to the level of the core voltage VCORE.

In the semiconductor memory device adopting the overdriving method and the discharge driving method in accordance with the conventional art as described above, in order to drop the voltage level of the power line RTO in the discharge driving period RELEASE, a method of connecting the power line RTO to a ground voltage (VSS) terminal during the discharge driving period RELEASE is used, thereby allowing the voltage level of the power line RTO to reach the level of the core voltage VCORE.

However, in connecting the power line RTO to the ground voltage (VSS) terminal means that the charge loaded on the power line RTO is discarded.

That is, since the voltage of the power line RTO to be lowered in the discharge driving period is a part of power provided through the overdriving operation, discarding the power by connecting the power line RTO to the ground voltage (VSS) terminal in the conventional art represents that a part of power provided to the semiconductor memory device is wasted.

The amount of the power wasted in the conventional art as described above may be considered to be relatively small. However, since an operation for sensing/amplifying bit lines is very frequently performed and is always performed in the semiconductor memory device during the operation of the semiconductor memory device, the collected amount of the wasted power may be considerable.

SUMMARY

Exemplary embodiments of the present invention are directed to a circuit and a method capable of preventing charge from being discarded during a discharge driving period in a semiconductor memory device adopting an overdriving method and a discharge driving method.

In accordance with an exemplary embodiment of the present invention, a semiconductor memory device includes a bit line sense amplification unit configured to sense/amplify data loaded on a bit line, and a driving control unit configured to supply a power line of the bit line sense amplification unit with an overdriving voltage in an overdriving period and supply an internal voltage line with a voltage of the power line of the bit line sense amplification unit in a discharge driving period.

In accordance with an exemplary embodiment of the present invention, a semiconductor memory device includes a plurality of internal voltage generation units respectively configured to detect voltage levels of a plurality of internal voltage lines in response to a plurality of target levels, generate a plurality of detection signals, and supply the plurality of internal voltage lines with an overdriving voltage in response to the plurality of detection signals, a bit line sense amplification unit configured to sense/amplify data loaded on a bit line, a driving control unit configured to supply a power line of the bit line sense amplification unit with an overdriving voltage in an overdriving period and supply the plurality of internal voltage lines with a voltage of the power line of the bit line sense amplification unit in response to a plurality of discharge control signals, and a discharge control signal generation unit configured to generate the plurality of discharge control signals in response to a discharge driving control signal, corresponding to a discharge driving period, and the plurality of detection signals.

In accordance with an exemplary embodiment of the present invention, a method for operating a semiconductor memory device includes sensing and amplifying data loaded on a bit line by using voltages of a power line and a ground line, supplying the power line with an overdriving voltage in a overdriving period of the sensing and amplifying of the data, supplying an internal voltage line with the voltage of the power line in a discharge driving period of the sensing and amplifying of the data, and supplying the power line with a core voltage lower than the overdriving voltage in a normal driving period of the sensing and amplifying of the data.

In accordance with an exemplary embodiment of the present invention, a semiconductor device includes a first line having a first voltage level; a second line having a second voltage level lower than the first voltage level; and a driving control unit configured to drive the first line to a third voltage level greater than the first voltage level in a driving period, and couple the first line, which is driven to the third voltage level, to the second line in a discharge period.

DETAILED DESCRIPTION

Figure 1:
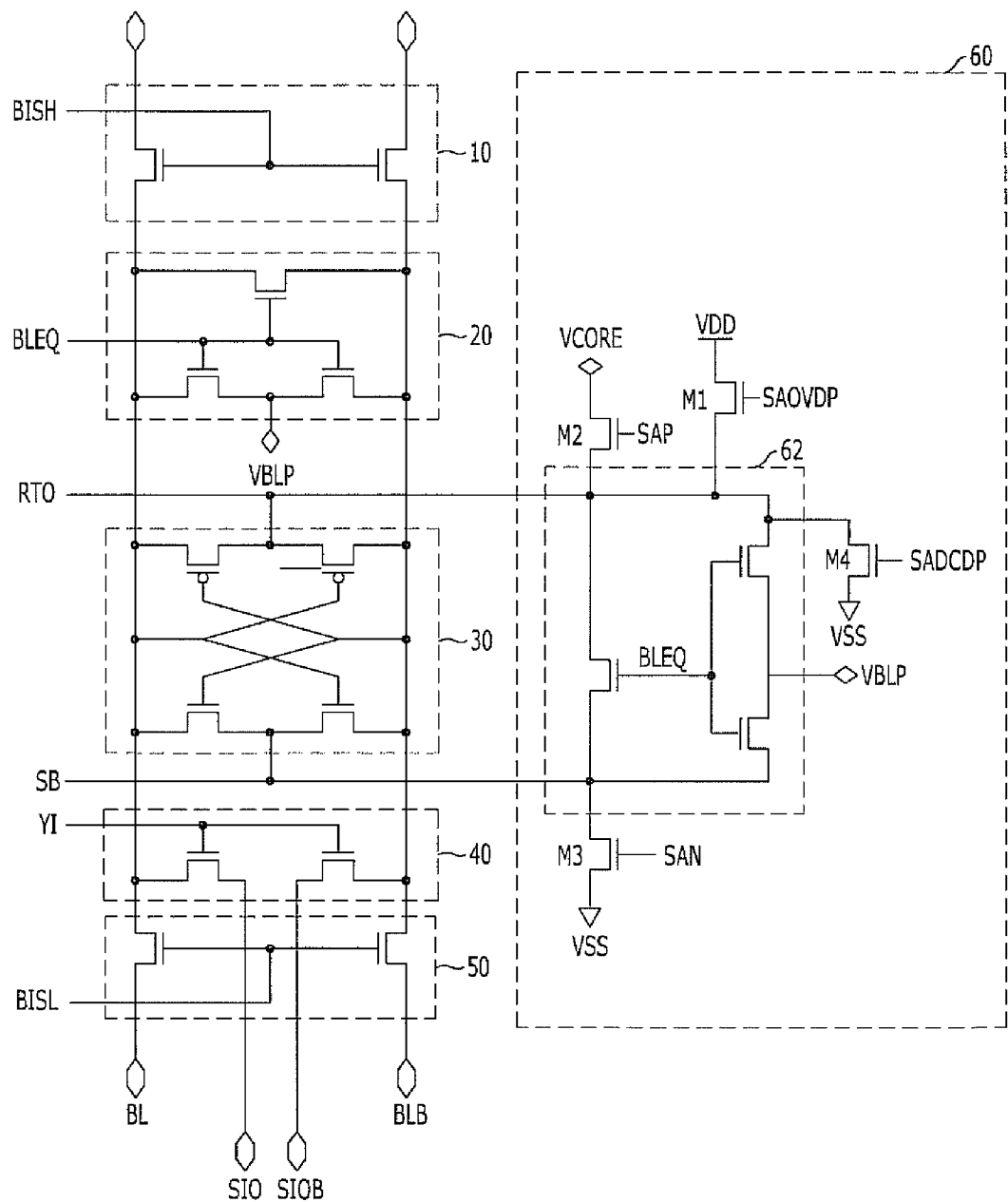
FIG. 1 is a detailed circuit diagram illustrating the configuration of a bit line sense amplifier array of a semiconductor memory device adopting an overdriving method and a discharge driving method in accordance with the conventional art.
Figure 2:
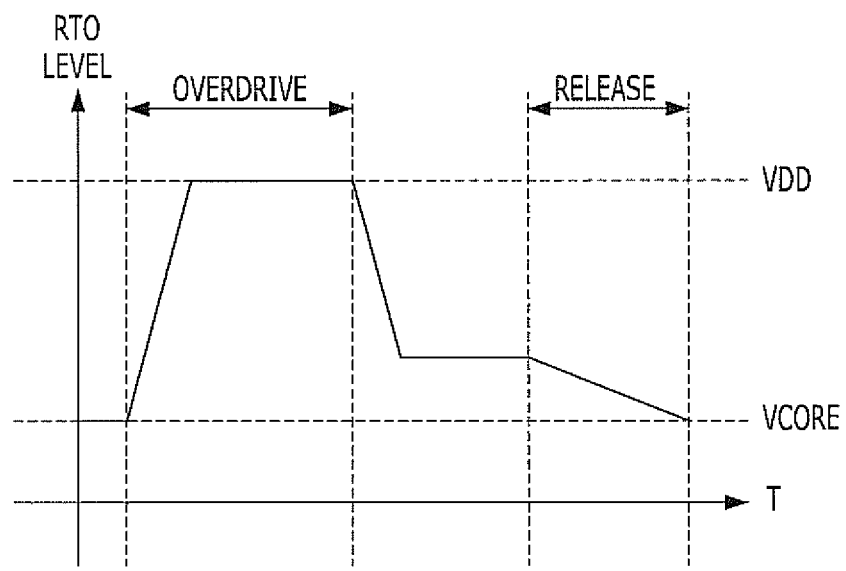
FIG. 2 is a timing diagram illustrating a change in the voltage level of a power line RTO of a bit line sense amplifier according to a sense amplification operation of a semiconductor memory device adopting an overdriving method and a discharge driving method in accordance with the conventional art shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First Embodiment

Figure 3:
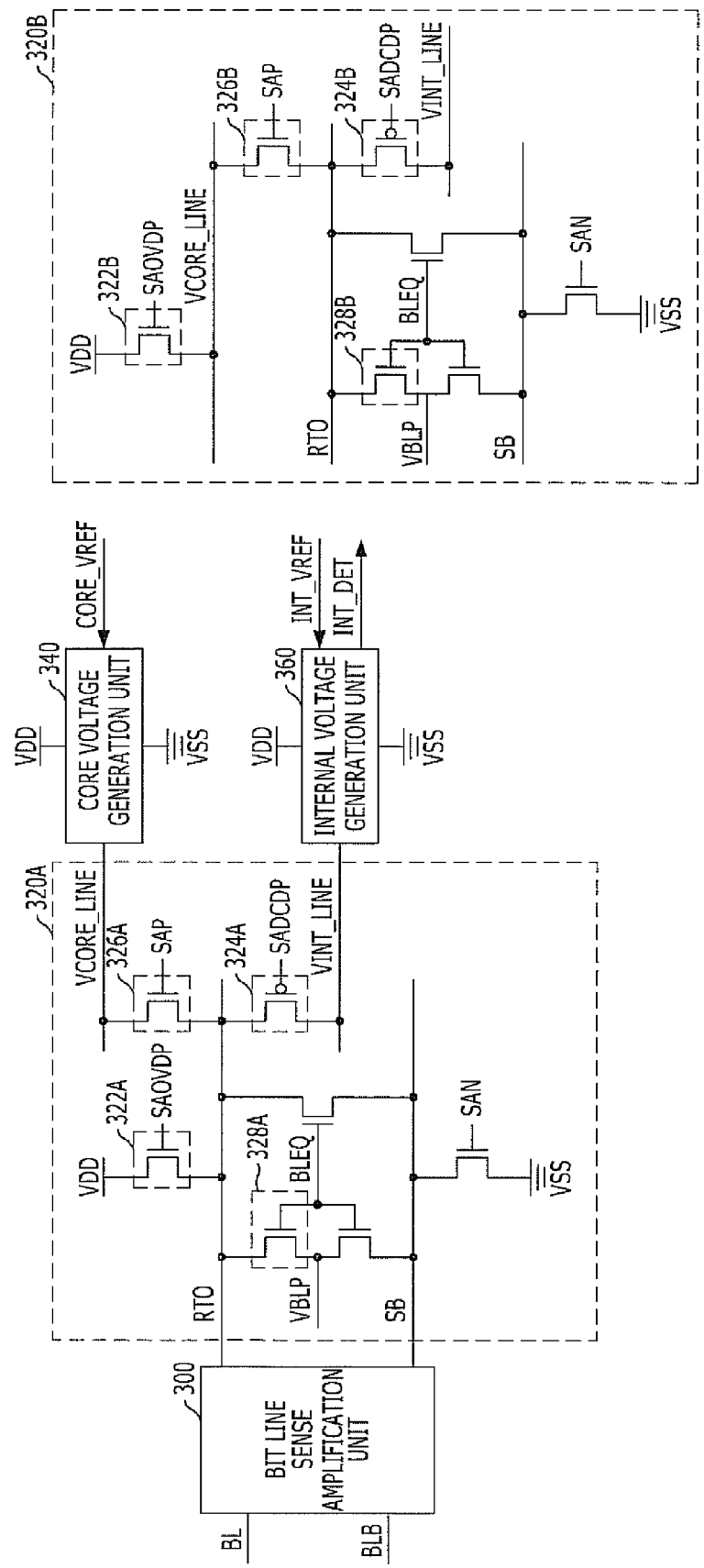
FIG. 3 is a detailed circuit diagram illustrating the configuration of a semiconductor memory device adopting an overdriving method and a discharge driving method in accordance with a first exemplary embodiment of the present invention.

FIG. 3 is a detailed circuit diagram illustrating the configuration of a semiconductor memory device adopting an overdriving method and a discharge driving method in accordance with a first exemplary embodiment of the present invention.

Referring to FIG. 3, the semiconductor memory device adopting the overdriving method and the discharge driving method in accordance with the first exemplary embodiment of the present invention includes a bit line sense amplification unit 300, and a driving control unit 320A or 320B. The bit line sense amplification unit 300 is configured to sense/amplify data loaded on bit lines BL and BLB. The driving control unit 320A or 320B is configured to drive a power line RTO of the bit line sense amplification unit 300 with an overdriving voltage VDD in a preset overdriving period and drive a set internal voltage line VINT_LINE with the voltage of the power line RTO of the bit line sense amplification unit 300 in a preset discharge driving period, wherein the overdriving period starts when an overdriving control signal SAOVDP is activated and ends when the overdriving control signal SAOVDP is deactivated. The discharge driving period starts when a discharge driving control signal SADCDP is activated and ends when the discharge driving control signal SADCDP is deactivated. That is, the driving control unit 320A or 320B is configured to supply the power line RTO of the bit line sense amplification unit 300 with the overdriving voltage VDD in the preset overdriving period and supply the set internal voltage line VINT_LINE with the voltage of the power line RTO of the bit line sense amplification unit 300 in the preset discharge driving period, The semiconductor memory device further includes a core voltage generation unit 340 and an internal voltage generation unit 360. The core voltage generation unit 340 is configured to drive a core voltage line VCORE_LINE with an overdriving voltage (VDD) on the basis of a preset target level which is a voltage level corresponding to a core reference voltage CORE_VREF. The internal voltage generation unit 360 is configured to drive the internal voltage line VINT_LINE with the overdriving voltage (VDD) on the basis of a target level (a voltage level corresponding to an internal reference voltage VINT_VREF) set in a preset internal voltage generation period, wherein the internal voltage generation period starts when an internal voltage detection signal INT_DET is activated and ends when the internal voltage detection signal INT_DET is deactivated.

The driving control unit may have various configurations, e.g., 320A and 320B, depending on an overdriving operation method as illustrated in FIG. 3.

In case of the driving control unit 320A, the power line RTO of the bit line sense amplification unit 300 directly receives charge from the overdriving voltage (VDD) terminal in the overdriving operation period. In detail, the driving control unit 320A includes an overdriving switch section 322A, a discharge driving switch section 324A, a normal driving switch section 326A, and a precharge switch section 328A.

The overdriving switch section 322A is configured to connect the overdriving voltage (VDD) terminal to the power line RTO of the bit line sense amplification unit 300 in the overdriving operation period and disconnect the overdriving voltage (VDD) terminal from the power line RTO of the bit line sense amplification unit 300 in remaining operation periods except for the overdriving operation period. The discharge driving switch section 324A is configured to connect the internal voltage line VINT_LINE to the power line RTO of the bit line sense amplification unit 300 in the discharge driving period and disconnect the internal voltage line VINT_LINE from the power line RTO of the bit line sense amplification unit 300 in remaining operation periods except for the discharge driving period. The normal driving switch section 326A is configured to connect the core voltage line VCORE_LINE to the power line RTO of the bit line sense amplification unit 300 in a preset normal driving period and disconnect the core voltage line VCORE_LINE from the power line RTO of the bit line sense amplification unit 300 in remaining operation periods except for the normal driving period, wherein the normal driving period starts when a normal driving control signal SAP is activated and ends when the normal driving control signal SAP is deactivated. The precharge switch section 328A is configured to connect the power line RTO of the bit line sense amplification unit 300 to a bit line precharge voltage (VBLP) terminal in a precharge operation period and disconnect the power line RTO of the bit line sense amplification unit 300 from the bit line precharge voltage (VBLP) terminal in remaining operation periods except for the precharge operation period, wherein the precharge operation period starts when a precharge operation control signal BLEQ is activated and ends when the precharge operation control signal BLEQ is deactivated.

In case of the driving control unit 320B, the power line RTO of the bit line sense amplification unit 300 receives charge from the overdriving voltage (VDD) terminal through the core voltage line VCORE_LINE in the overdriving operation period. In detail, the driving control unit 320B includes an overdriving switch section 322B, a sense amplification operation switch section 326B, a discharge driving switch section 324B, and a precharge switch section 328B.

The overdriving switch section 322B is configured to connect the overdriving voltage (VDD) terminal to the core voltage line VCORE_LINE in the overdriving operation period and disconnect the overdriving voltage (VDD) terminal from the core voltage line VCORE_LINE in remaining operation periods except for the overdriving operation period. The sense amplification operation switch section 326B is configured to connect the core voltage line VCORE_LINE to the power line RTO of the bit line sense amplification unit 300 in the overdriving operation period, the discharge driving period, and the normal driving period and disconnect the core voltage line VCORE_LINE from the power line RTO of the bit line sense amplification unit 300 in a remaining operation period except for the overdriving operation period, the discharge driving period, and the normal driving period. The discharge driving switch section 324B is configured to connect the internal voltage line VINT_LINE to the power line RTO of the bit line sense amplification unit 300 (or the core voltage line VCORE_LINE) in the discharge driving period and disconnect the power line RTO of the bit line sense amplification unit 300 from the internal voltage line VINT_LINE in remaining operation periods except for the discharge driving period. The precharge switch section 328B is configured to connect the power line RTO of the bit line sense amplification unit 300 to the bit line precharge voltage (VBLP) terminal in the precharge operation period and disconnect the power line RTO of the bit line sense amplification unit 300 from the bit line precharge voltage (VBLP) terminal in remaining operation periods except for the precharge operation period.

In the configurations of the above-mentioned driving control unit 320A or 320B, the switch sections, that is, the overdriving switch sections 322A and 322B, the discharge driving switch sections 324A and 324B, the normal driving switch section 326A, the sense amplification operation switch section 326B, and the precharge switch sections 328A and 328B, include an NMOS transistor or a PMOS transistor in FIG. 3. However, this is for illustrative purposes only. For example, depending on a circuit design method, a switch section including an NMOS transistor may replace the NMOS transistor with a PMOS transistor, or a switch section including a PMOS transistor may replace the PMOS transistor with a NMOS transistor. Furthermore, instead of a switch section including the MOS transistor, other types of switches may also be used.

Hereinafter, an operation of the semiconductor memory device adopting the overdriving method and the discharge driving method in accordance with the first exemplary embodiment of the present invention will be described based on the above-mentioned configuration.

At a preset time point after an active operation period including the overdriving period, the discharge driving period, and the normal driving period starts, the overdriving control signal SAOVDP is activated and the overdriving period starts, wherein the active operation period generally starts in response to the application of an active command and ends in response to the application of a precharge command.

When the overdriving period starts, the driving control unit 320A or 320B operates to allow charge to be supplied to the power line RTO of the bit line sense amplification unit 300 through the overdriving voltage (VDD) terminal. That is, in the driving control unit 320A having a first configuration, the power line RTO of the bit line sense amplification unit 300 is directly driven by the overdriving voltage VDD. In the driving control unit 320B having a second configuration, the core voltage line VCORE_LINE is driven by the overdriving voltage VDD, and then the power line RTO of the bit line sense amplification unit 300 is driven by the voltage of the core voltage line VCORE_LINE. Thus, the power line RTO of the bit line sense amplification unit 300 has a level substantially the same as the overdriving voltage VDD.

Then, the overdriving control signal SAOVDP is deactivated and the overdriving period ends, so that no charge is supplied to the power line RTO of the bit line sense amplification unit 300 through the overdriving voltage (VDD) terminal. Thus, the power line RTO of the bit line sense amplification unit 300 does not substantially maintain the level of the overdriving voltage VDD and falls to a level lower than the level of the overdriving voltage VDD.

Then, at a preset time point, the discharge driving control signal SADCDP is activated and the discharge driving period starts.

When the discharge driving period starts, the driving control unit 320A or 320B operates to allow charge to be supplied to the internal voltage line VINT_LINE through the power line RTO of the bit line sense amplification unit 300. That is, the internal voltage line VINT_LINE is driven by the voltage of the power line RTO of the bit line sense amplification unit 300, so that the voltage level of the power line RTO of the bit line sense amplification unit 300 falls and the voltage level of the internal voltage line VINT_LINE rises.

In order to achieve the operation as described above, the voltage level of the internal voltage line VINT_LINE is to be lower than the voltage level of the power line RTO of the bit line sense amplification unit 300 during the discharge driving period. In order to meet such conditions, the target level of the internal voltage line VINT_LINE is to be substantially equal to or lower than the target level of the core voltage line VCORE_LINE. That is, in general, after the overdriving period ends, the power line RTO of the bit line sense amplification unit 300 has a level which is lower than the level of the overdriving voltage VDD and higher than the level of the core voltage VCORE until the discharge driving period starts. Therefore, when the target level of the internal voltage line VINT_LINE is substantially equal to or lower than the target level of the core voltage line VCORE_LINE, the above-mentioned operation is achieved at any cases. Accordingly, in a semiconductor memory device, an internal voltage VINT may include a bit line precharge voltage VBLP or a cell plate voltage VCP, for example.

Furthermore, it is preferable to allow the discharge driving operation period to overlap the operation period of the internal voltage generation unit 360 that drives the internal voltage line VINT_LINE at a preset internal voltage target level using the overdriving voltage (VDD). That is, since the internal voltage generation unit 360 operates when the voltage level of the internal voltage line VINT_LINE is lower than a preset internal voltage target level, it may be more efficient when charge supplied from the power line RTO of the bit line sense amplification unit 300 is used to increase the voltage level of the internal voltage line VINT_LINE while the operation period of the internal voltage generation unit 360 overlaps the discharge driving operation period. Of course, even when the operation period of the internal voltage generation unit 360 does not overlap the discharge driving operation period, the charge supplied from the power line RTO of the bit line sense amplification unit 300 may be used to allow the voltage level of the internal voltage line VINT_LINE to slowly fall below the target level. This may be controlled and changed depending on a circuit design.

Then, the discharge driving control signal SADCDP is deactivated and the discharge driving period ends, so that no charge is supplied to the internal voltage line VINT_LINE through the power line RTO of the bit line sense amplification unit 300.

Thereafter, at a preset time point, the normal driving control signal SAP is activated and the normal driving period starts.

When the normal driving period starts, the driving control unit 320A or 320B operates to allow charge to be supplied to the power line RTO of the bit line sense amplification unit 300 through the core voltage line VCORE_LINE. That is, the driving control unit 320A or 320B operates to allow the power line RTO of the bit line sense amplification unit 300 to have a level substantially the same as the core voltage line VCORE_LINE. At this time, the core voltage line VCORE_LINE has a target level of the core reference voltage CORE_VREF other than the level of the overdriving voltage VDD.

In this way, when the overdriving operation period, the discharge driving operation period, and the normal operation period end in the active operation period, the precharge operation period starts, so that the precharge operation control signal BLEQ is activated and thus the power line RTO and a ground line SB of the bit line sense amplification unit 300 are precharged by the bit line precharge voltage VBLP, wherein the precharge operation period starts in response to the application of a precharge command and ends in response to the application of an active command.

As described above, when the first embodiment of the present invention is applied to the semiconductor memory device adopting the overdriving method and the discharge driving method, a certain internal voltage line VINT_LINE may be supplied with the overdriving charge which has flown to the ground voltage (VSS) terminal during the discharge driving operation period in the conventional art. That is, power discarded in the conventional art may be reutilized, resulting in a significant reduction of current consumption in the semiconductor memory device.

The amount of power to be reutilized through the first embodiment of the present invention may be considered to be small during a one-time overdriving operation period and discharge driving operation period. However, since an operation for sensing/amplifying a bit line is very frequently performed in the semiconductor memory device and is always performed during the operation of the semiconductor memory device, the great amount of the power may be collected and reutilized.

Second Embodiment

Figure 4:
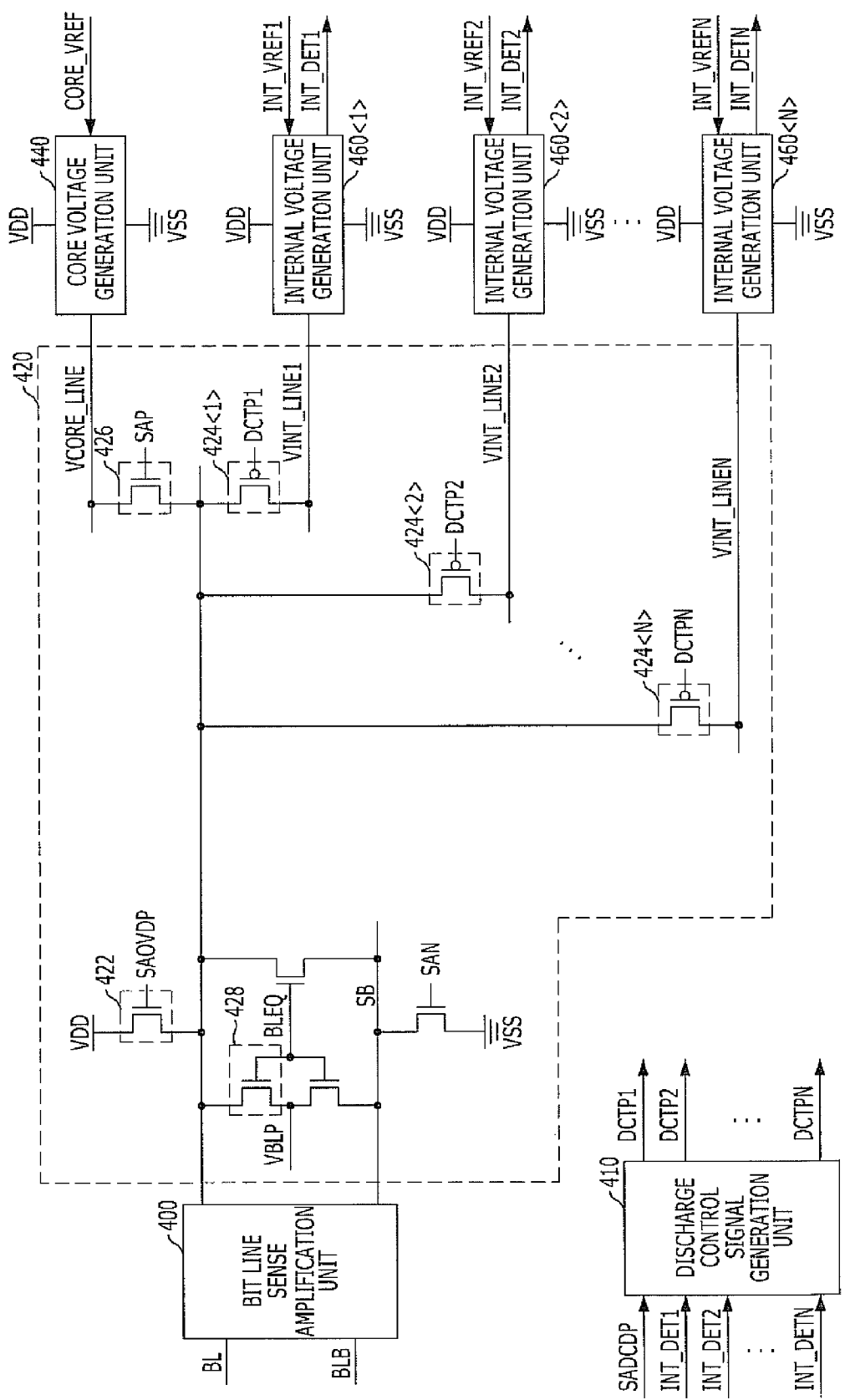
FIG. 4 is a detailed circuit diagram illustrating the configuration of a semiconductor memory device adopting an overdriving method and a discharge driving method in accordance with a second exemplary embodiment of the present invention.

FIG. 4 is a detailed circuit diagram illustrating the configuration of a semiconductor memory device adopting an overdriving method and a discharge driving method in accordance with a second exemplary embodiment of the present invention.

The semiconductor memory device illustrated in FIG. 3 employing the overdriving method and the discharge driving method in accordance with the first exemplary embodiment of the present invention is substantially equal to the semiconductor memory device shown in FIG. 4 employing the overdriving method and the discharge driving method in accordance with the second exemplary embodiment of the present invention, except that a plurality of internal voltage lines are supplied with surplus power in the discharge driving period, and a discharge control signal generation unit 410 is further provided to determine a criterion for supplying the plurality of internal voltage lines with the surplus power in the discharge driving period.

In detail, referring to FIG. 4, the semiconductor memory device adopting the overdriving method and the discharge driving method in accordance with the second exemplary embodiment of the present invention includes a plurality of internal voltage generation units 460<1:N>, a bit line sense amplification unit 400, a driving control unit 420, the discharge control signal generation unit 410, and a core voltage generation unit 440.

The plurality of internal voltage generation units 460<1:N> are configured to detect the voltage levels of a plurality of internal voltage lines VINT_LINE<1:N> on the basis of a plurality of target levels corresponding to a plurality of internal reference voltages INT_VREF<1:N>, generate a plurality of detection signals INT_DET<1:N>, and drive the plurality of internal voltage lines VINT_LINE<1:N> with an overdriving voltage (VDD) in response to the plurality of detection signals INT_DET<1:N>, respectively. The bit line sense amplification unit 400 is configured to sense/amplify data loaded on bit lines BL and BLB. The driving control unit 420 is configured to drive a power line RTO of the bit line sense amplification unit 400 by using an overdriving voltage VDD in a preset overdriving period and drive the plurality of internal voltage lines VINT_LINE<1:N> by using the voltage of the power line RTO of the bit line sense amplification unit 400 in response to a plurality of discharge control signals DCTP<1:N>, wherein the overdriving period starts when an overdriving control signal SAOVDP is activated and ends when the overdriving control signal SAOVDP is deactivated. The discharge control signal generation unit 410 is configured to generate the plurality of discharge control signals DCTP<1:N> in response to a discharge driving control signal SADCDP corresponding to a preset discharge driving period and the plurality of detection signals INT_DET<1:N>, wherein the discharge driving period starts when a discharge driving control signal SADCDP is activated and ends when the discharge driving control signal SADCDP is deactivated. The core voltage generation unit 440 is configured to drive a core voltage line VCORE_LINE with the overdriving voltage (VDD) on the basis of a preset target level which is a voltage level corresponding to a core reference voltage CORE_VREF.

The driving control unit 420 may include a first configuration employing an overdriving operation method illustrated in FIG. 4 and a second configuration employing another overdriving operation method not illustrated in FIG. 4. The first configuration of the driving control unit 420 illustrated in FIG. 4 is substantially similar to the configuration of the driving control unit 320A illustrated in FIG. 3, and the second configuration of the driving control unit 420 omitted from FIG. 4 is substantially similar to the configuration of the driving control unit 320B illustrated in FIG. 3. Therefore, the second configuration of the driving control unit 420 will be described with reference to the configuration of the driving control unit 320B illustrated in FIG. 3.

The case will be first described, in which the power line RTO of the bit line sense amplification unit 400 directly receives charge from the overdriving voltage (VDD) terminal in the overdriving operation period as illustrated in FIG. 4. In detail, the driving control unit 420 includes an overdriving switch section 422, a plurality of discharge driving switch sections 424<1:N>, a normal driving switch section 426, and a precharge switch section 428. The overdriving switch section 422 is configured to connect the overdriving voltage (VDD) terminal to the power line RTO of the bit line sense amplification unit 400 in the overdriving operation period and disconnect the overdriving voltage (VDD) terminal from the power line RTO of the bit line sense amplification unit 400 in remaining operation periods except for the overdriving operation period. The plurality of discharge driving switch sections 424<1:N> are configured to connect the power line RTO of the bit line sense amplification unit 400 to the plurality of internal voltage lines VINT_LINE<1:N> in response to the plurality of discharge control signals DCTP<1:N> in the discharge driving operation period. The normal driving switch section 426 is configured to connect the core voltage line VCORE_LINE to the power line RTO of the bit line sense amplification unit 400 in a preset normal driving operation period and disconnect the core voltage line VCORE_LINE from the power line RTO of the bit line sense amplification unit 400 in remaining operation periods except for the normal driving operation period, wherein the normal driving operation period starts when a normal driving control signal SAP is activated and ends when the normal driving control signal SAP is deactivated. The precharge switch section 428 is configured to connect the power line RTO of the bit line sense amplification unit 400 to a bit line precharge voltage (VBLP) terminal in a precharge operation period and disconnect the power line RTO of the bit line sense amplification unit 400 from the bit line precharge voltage (VBLP) terminal in remaining operation periods except for the precharge operation period, wherein the precharge operation period starts when a precharge operation control signal BLEQ is activated and ends when the precharge operation control signal BLEQ is deactivated.

Another case omitted from FIG. 4 will be described, in which the power line RTO of the bit line sense amplification unit 400 receives charge from the overdriving voltage (VDD) terminal through the core voltage line VCORE_LINE in the overdriving operation period. In detail, the driving control unit 420 includes an overdriving switch section 322B, a sense amplification operation switch section 326B, a plurality of discharge driving switch sections 424<1:N>, and a precharge switch section 428. The overdriving switch section 322B is configured to connect the overdriving voltage (VDD) terminal to the core voltage line VCORE_LINE in the overdriving operation period and disconnect the overdriving voltage (VDD) terminal from the core voltage line VCORE_LINE in remaining operation periods except for the overdriving operation period. The sense amplification operation switch section 326B is configured to connect the core voltage line VCORE_LINE to the power line RTO of the bit line sense amplification unit 400 in the overdriving operation period, the discharge driving period, and the normal driving period and disconnect the core voltage line VCORE_LINE from the power line RTO of the bit line sense amplification unit 400 in a remaining operation period except for the overdriving operation period, the discharge driving period, and the normal driving period. The plurality of discharge driving switch sections 424<1:N> are configured to connect the power line RTO of the bit line sense amplification unit 400 (or the core voltage line VCORE_LINE) to the plurality of internal voltage lines VINT_LINE<1:N> in response to the plurality of discharge control signals DCTP<1:N> in the discharge driving operation period. The precharge switch section 428 is configured to connect the power line RTO of the bit line sense amplification unit 400 to the bit line precharge voltage (VBLP) terminal in the precharge operation period and disconnect the power line RTO of the bit line sense amplification unit 400 from the bit line precharge voltage (VBLP) terminal in remaining operation periods except for the precharge operation period.

In the configuration of the above-mentioned driving control unit 420, the switch sections, that is, the overdriving switch section 422, the plurality of discharge driving switch sections 424<1:N>, the normal driving switch section 426, the sense amplification operation switch section 326B, and the precharge switch section 428, include an NMOS transistor or a PMOS transistor in FIG. 4. However, this is for illustrative purposes only. For example, depending on a circuit design method, a switch section including an NMOS transistor may replace the NMOS transistor with a PMOS transistor, or a switch section including a PMOS transistor may replace the PMOS transistor with an NMOS transistor. Furthermore, instead of a switch section including the MOS transistor, other types of switches may also be used.

Figure 5:
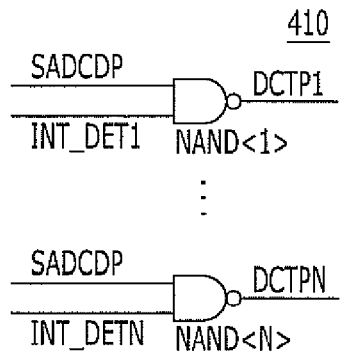
FIG. 5 is a detailed circuit diagram illustrating a discharge delivery control signal generation unit of the semiconductor memory device shown in FIG. 4.

FIG. 5 is a detailed circuit diagram illustrating the discharge control signal generation unit 410 of the semiconductor memory device shown in FIG. 4.

Referring to FIG. 5, the discharge control signal generation unit 410 includes a plurality of NAND gates NAND<1:N> configured to receive the discharge driving control signal SADCDP through first input terminals thereof, receive the plurality of detection signals INT_DET<1:N> through second input terminals thereof, perform an NAND operation on the received signals, and generate the plurality of discharge control signals DCTP<1:N>.

In detail, when the discharge driving control signal SADCDP is activated and the discharge driving period starts, the discharge control signal generation unit 410 activates some of the plurality of discharge control signals DCTP<1:N>, corresponding to the activated detection signals of the plurality of detection signals INT_DET<1:N>, and deactivates remaining signals except for the some of the plurality of discharge control signals DCTP<1:N>, corresponding to deactivated detection signals. Of course, when the discharge driving control signal SADCDP is deactivated and the discharge driving period ends, the discharge control signal generation unit 410 deactivates all the plurality of discharge control signals DCTP<1:N> regardless of whether the detection signals INT_DET<1:N> are activated.

Figure 6:
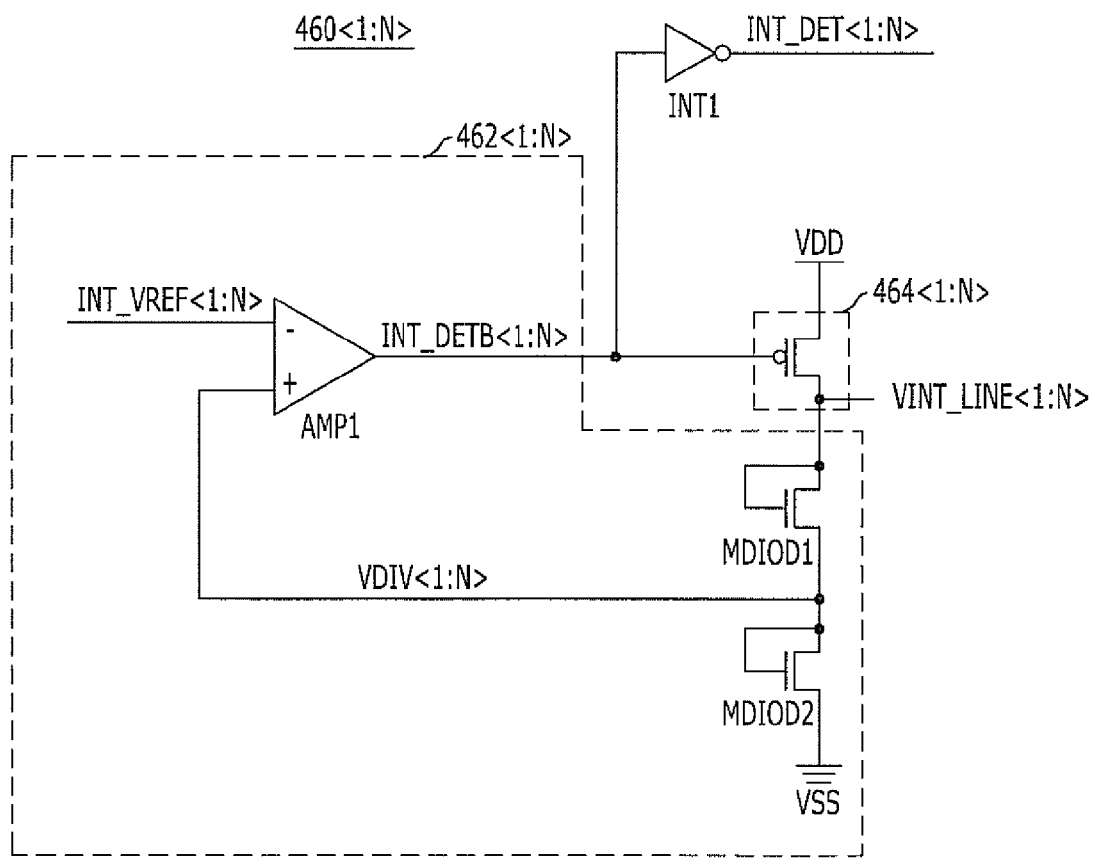
FIG. 6 is a detailed circuit diagram illustrating a plurality of internal voltage generation units of the semiconductor memory device shown in FIG. 4.

FIG. 6 is a detailed circuit diagram illustrating the plurality of internal voltage generation units 460<1:N> of the semiconductor memory device illustrated in FIG. 4.

Referring to FIG. 6, the internal voltage generation units 460<1:N> include detection sections 462<1:N> and driving sections 464<1:N>, respectively. The detection sections 462<1:N> are configured to detect a level of a corresponding one of the plurality of internal voltage lines VINT_LINE<1:N> and determine whether to activate a corresponding detection signal of the plurality of detection signals INT_DET<1:N> in response to a detection result, respectively. The driving sections 464<1:N> are configured to drive the corresponding internal voltage line with the overdriving voltage (VDD) in an activation period of the corresponding detection signal and do not drive the corresponding internal voltage line in a deactivation period thereof.

Hereinafter, an operation of the semiconductor memory device adopting the overdriving method and the discharge driving method in accordance with the second exemplary embodiment of the present invention will be described based on the above-mentioned configuration.

At a preset time point after an active operation period including the overdriving period, the discharge driving period, and the normal driving period starts, the overdriving control signal SAOVDP is activated and the overdriving period starts, wherein the active operation period generally starts in response to the application of an active command and ends in response to the application of a precharge command.

When the overdriving period starts, the driving control unit 420 operates to allow charge to be supplied to the power line RTO of the bit line sense amplification unit 400 through the overdriving voltage (VDD) terminal. That is, in the first configuration of the driving control unit illustrated in FIG. 4, the power line RTO of the bit line sense amplification unit 400 is directly driven by the overdriving voltage VDD. In the second configuration omitted from FIG. 4, referring to FIG. 3, the core voltage line VCORE_LINE is driven by the overdriving voltage VDD, and then the power line RTO of the bit line sense amplification unit 400 is directly driven by the voltage of the core voltage line VCORE_LINE. Thus, the power line RTO of the bit line sense amplification unit 400 has a level substantially the same as the overdriving voltage VDD.

Then, the overdriving control signal SAOVDP is deactivated and the overdriving period ends, so that no charge is supplied to the power line RTO of the bit line sense amplification unit 400 through the overdriving voltage (VDD) terminal. Thus, the power line RTO of the bit line sense amplification unit 400 does not substantially maintain the level of the overdriving voltage VDD and falls to a level lower than the level of the overdriving voltage VDD.

Then, at a preset time point, the discharge driving control signal SADCDP is activated and the discharge driving period starts.

When the discharge driving period starts, the driving control unit 420 operates to allow charge to be supplied to the plurality of internal voltage lines VINT_LINE through the power line RTO of the bit line sense amplification unit 400. Of course, the discharge control signal generation unit 410 activates some of the plurality of discharge control signals DCTP<1:N> in response to activated detection signals of the plurality of detection signals INT_DET<1:N>, so that some of the plurality of internal voltage lines VINT_LINE are determined to actually receive the charge through the power line RTO of the bit line sense amplification unit 400. That is, internal voltage lines corresponding to the activated detection signals of the plurality of detection signals INT_DET<1:N> actually receive the charge through the power line RTO of the bit line sense amplification unit 400, and the other internal voltage lines receive no charge through the power line RTO of the bit line sense amplification unit 400. Thus, some of the plurality of internal voltage lines VINT_LINE are driven by the voltage of the power line RTO of the bit line sense amplification unit 400, resulting in a reduction of the voltage level of the power line RTO of the bit line sense amplification unit 400 and an increase in the voltage levels of some of the internal voltage lines receiving the charge. Of course, the voltage levels of the other internal voltage lines receiving no charge are not affected.

In order to achieve the operation as described above, the voltage level of the internal voltage line VINT_LINE is to be lower than the voltage level of the power line RTO of the bit line sense amplification unit 400 during the discharge driving period. In order to meet such conditions, the target level of the internal voltage line VINT_LINE is to be substantially equal to or lower than the target level of the core voltage line VCORE_LINE. That is, in general, after the overdriving period ends, the power line RTO of the bit line sense amplification unit 400 has a level which is lower than the level of the overdriving voltage VDD and higher than the level of the core voltage VCORE until the discharge driving period starts. Therefore, when the target level of the internal voltage line VINT_LINE is substantially equal to or lower than the target level of the core voltage line VCORE_LINE, the above-mentioned operation is achieved at any cases. Accordingly, in a semiconductor memory device, an internal voltage VINT may include a bit line precharge voltage VBLP or a cell plate voltage VCP, for example.

Furthermore, in the above-mentioned operation, charge is supplied from the power line RTO of the bit line sense amplification unit 400 to only an internal voltage line corresponding to an internal voltage generation unit, which performs an internal voltage generation operation, among the plurality of internal voltage generation units 460<1:N> during the discharge driving operation period, so that an operation for reutilizing charge more efficiently is performed. That is, since a plurality of internal voltages VINT are provided, the operation period of at least one of the plurality of internal voltage generation units 460<1:N> may overlap the discharge driving operation period. At this time, since the plurality of internal voltage generation units 460<1:N> operates when the voltage levels of the plurality of internal voltage lines VINT_LINE<1:N> is lower than a preset internal voltage target level, charge supplied from the power line RTO of the bit line sense amplification unit 400 is used to increase the voltage level of at least one of the plurality of internal voltage lines VINT_LINE<1:N> in the state that the voltage level is lower than the preset internal voltage target level.

Then, the discharge driving control signal SADCDP is deactivated and the discharge driving period ends, so that no charge is supplied to the plurality of internal voltage lines VINT_LINE<1:N> through the power line RTO of the bit line sense amplification unit 400.

Thereafter, at a preset time point, the normal driving control signal SAP is activated and the normal driving period starts.

When the normal driving period starts, the driving control unit 420 operates to allow charge to be supplied to the power line RTO of the bit line sense amplification unit 400 through the core voltage line VCORE_LINE. That is, the driving control unit 420 operates to allow the power line RTO of the bit line sense amplification unit 400 to have a level substantially the same as the core voltage line VCORE_LINE. At this time, the core voltage line VCORE_LINE has a target level of a core reference voltage CORE_VREF, other than the level of the overdriving voltage VDD.

In this way, when the overdriving operation period, the discharge driving operation period, and the normal operation period end in the active operation period, the precharge operation period starts, so that the precharge operation control signal BLEQ is activated and thus the power line RTO and a ground line SB of the bit line sense amplification unit 400 are precharged by the bit line precharge voltage VBLP, wherein the precharge operation period starts in response to the application of a precharge command and ends in response to the application of an active command.

As described above, when the second embodiment of the present invention is applied to the semiconductor memory device adopting the overdriving method and the discharge driving method, a plurality of internal voltage lines VINT_LINE<1:N> may be supplied with the overdriving charge which has flown to the ground voltage (VSS) terminal during the discharge driving operation period in the conventional art. Specifically, overdriving charge is supplied only to internal voltage lines having voltage levels lower than the target level among the plurality of internal voltage lines VINT_LINE<1:N>, so that overdriving charge may be used more efficiently. That is, power discarded in the conventional art may be reutilized, resulting in a significant reduction of current consumption in the semiconductor memory device.

The amount of power to be reutilized through the second embodiment of the present invention may be considered to be small during a one-time overdriving operation period and discharge driving operation period. However, since an operation for sensing/amplifying a bit line is very frequently performed in the semiconductor memory device and is always performed during the operation of the semiconductor memory device, the great amount of the power may be collected and reutilized.

In accordance with the present invention as described above, overdriving driving charge may be supplied to a certain internal voltage line, so that current consumption may be significantly reduced in a semiconductor memory device adopting an overdriving method and a discharge driving method.

Furthermore, only an internal voltage line with a voltage level lower than a target level may be selected from a plurality of internal voltage lines and overdriving driving charge may be supplied to the selected internal voltage line, so that current consumption may be significantly reduced in a semiconductor memory device, which employs an overdriving method and a discharge driving method, in more efficient manner.

While the present invention has been described with respect to the specific embodiments, it will be apparent to those skilled in the art that various changes and modifications may be made without departing from the spirit and scope of the invention as defined in the following claims.

For example, the position and type of the logic gate and transistor described in the above-mentioned embodiment may be changed according to the polarity of an input signal.

What is claimed is:

1. A semiconductor memory device comprising:
   a bit line sense amplification unit configured to sense/amplify data loaded on a bit line;
   a driving control unit configured to supply a power line of the bit line sense amplification unit with an overdriving voltage in an overdriving period and supply an internal voltage line with a voltage of the power line of the bit line sense amplification unit in a discharge driving period;
   a core voltage generation unit configured to supply a core voltage terminal with the overdriving voltage in response to a core voltage target level; and
   an internal voltage generation unit configured to supply the internal voltage line with the overdriving voltage in response to an internal voltage target level during an internal voltage generation period.

2. The semiconductor memory device of claim 1, wherein the driving control unit comprises:
   an overdriving switch section configured to couple a terminal of the overdriving voltage to the power line of the bit line sense amplification unit in the overdriving operation period;
   a discharge driving switch section configured to couple the internal voltage line to the power line of the bit line sense amplification unit in the discharge driving period; and
   a normal driving switch section configured to couple the core voltage terminal to the power line of the bit line sense amplification unit in a normal driving period.

3. The semiconductor memory device of claim 2, wherein the driving control unit further comprises:
   a precharge switch section configured to couple the power line of the bit line sense amplification unit to a bit line precharge voltage terminal in a precharge operation period.

4. The semiconductor memory device of claim 2,
   wherein the internal voltage generation period starts when an internal voltage detection signal is activated and ends when the internal voltage detection signal is deactivated.

5. The semiconductor memory device of claim 4, wherein the internal voltage target level is equal to or lower than the core voltage target level.

6. The semiconductor memory device of claim 4, wherein the semiconductor memory device has an active operation period including the overdriving period, the discharge diving period, and the normal driving period,
   wherein the overdriving period starts after a first set time passes from an entry of the active operation period;
   the discharge driving period starts after a second set time passes from an end of the overdriving period; and
   the normal driving period starts after a third set time passes from an end of the discharge driving period.

7. The semiconductor memory device of claim 6, wherein the internal voltage generation period overlaps the discharge driving period.

8. The semiconductor memory device of claim 1, wherein the driving control unit comprises:

an overdriving switch section configured to couple a terminal of the overdriving voltage to a core voltage terminal in the overdriving operation period;
a sense amplification operation driving switch section configured to couple the core voltage terminal to the power line of the bit line sense amplification unit in the overdriving operation period, the discharge driving period, and a normal driving period; and
a discharge driving switch section configured to couple the power line of the bit line sense amplification unit to the internal voltage line in the discharge driving period.

9. A semiconductor memory device comprising:
   a plurality of internal voltage generation units respectively configured to detect voltage levels of a plurality of internal voltage lines in response to a plurality of target levels, generate a plurality of detection signals, and supply the plurality of internal voltage lines with an overdriving voltage in response to the plurality of detection signals;
   a bit line sense amplification unit configured to sense/amplify data loaded on a bit line;
   a driving control unit configured to supply a power line of the bit line sense amplification unit with an overdriving voltage in an overdriving period and supply the plurality of internal voltage lines with a voltage of the power line of the bit line sense amplification unit in response to a plurality of discharge control signals; and
   a discharge control signal generation unit configured to generate the plurality of discharge control signals in response to a discharge driving control signal, corresponding to a discharge driving period, and the plurality of detection signals.

10. The semiconductor memory device of claim 9, wherein the driving control unit comprises:
    an overdriving switch section configured to couple a terminal of the overdriving voltage to the power line of the bit line sense amplification unit in the overdriving operation period;
    a plurality of discharge driving switch sections configured to couple the power line of the bit line sense amplification unit to the plurality of internal voltage lines in response to the plurality of discharge control signals in the discharge driving period, respectively; and
    a normal driving switch section configured to couple a core voltage terminal to the power line of the bit line sense amplification unit in a normal driving period.

11. The semiconductor memory device of claim 10, wherein the driving control unit further comprises:
    a precharge switch section configured to couple the power line of the bit line sense amplification unit to a bit line precharge voltage terminal in a precharge operation period.

12. The semiconductor memory device of claim 10, further comprising:
    a core voltage generation unit configured to supply the core voltage terminal with the overdriving voltage in response to a target level.

13. The semiconductor memory device of claim 12, wherein the target levels of the plurality of internal voltage generation units are equal to or lower than the target level of the core voltage generation unit.

14. The semiconductor memory device of claim 9, wherein the driving control unit comprises:
    an overdriving switch section configured to couple a terminal of the overdriving voltage to a core voltage terminal in the overdriving operation period;

a sense amplification operation driving switch section configured to couple the core voltage terminal to the power line of the bit line sense amplification unit in the overdriving operation period, the discharge driving period, and a normal driving period; and
a plurality of discharge driving switch sections configured to couple the power line of the bit line sense amplification unit to the plurality of internal voltage lines in response to the plurality of discharge control signals in the discharge driving period, respectively.

15. The semiconductor memory device of claim 9, wherein each of the plurality of internal voltage generation units comprises:
a detection section configured to detect a voltage level of a corresponding internal voltage line among the plurality of internal voltage lines and determine whether to activate a corresponding detection signal of the plurality of detection signals in response to a detection result; and
a driving section configured to supply the corresponding internal voltage line with the overdriving voltage in an activation period of the corresponding detection signal.

16. The semiconductor memory device of claim 15, wherein, when the discharge driving control signal is activated, the discharge control signal generation unit activates a discharge control signal corresponding to an activated detection signal of the plurality of detection signals and deactivates a discharge control signal corresponding to a deactivated detection signal of the plurality of detection signals, among the plurality of discharge control signals; and
when the discharge driving control signal is deactivated, the discharge control signal generation unit deactivates the plurality of discharge control signals regardless of whether the detection signals are activated.

17. A semiconductor device comprising:
a first line having a first voltage level;
a second line having a second voltage level lower than the first voltage level;
a driving control unit configured to drive the first line to a third voltage level greater than the first voltage level in a driving period, and couple the first line, which is driven to the third voltage level, to the second line in a discharge period;
a core voltage generation unit configured to supply a core voltage terminal with the third voltage level in response to a core voltage target level; and
an internal voltage generation unit configured to supply the second line with the third voltage in response to an internal voltage target level during an internal voltage generation period.

18. The semiconductor device of claim 17, wherein the second voltage level is greater than a ground voltage level.

19. The semiconductor device of claim 17, wherein the internal voltage generation period starts when an internal voltage detection signal is activated and ends when the internal voltage detection signal is deactivated.

* * * * *